(12) United States Patent
Bandoh et al.

(10) Patent No.: US 7,855,386 B2
(45) Date of Patent: Dec. 21, 2010

(54) N-TYPE GROUP III NITRIDE SEMICONDUCTOR LAYERED STRUCTURE

(75) Inventors: Akira Bandoh, Ichihara (JP); Hiromitsu Sakai, Ichihara (JP); Masato Kobayakawa, Ichihara (JP); Mineo Okuyama, Ichihara (JP); Hideki Tomozawa, Ichihara (JP); Hisayuki Miki, Ichihara (JP); Joseph Gaze, Ichihara (JP); Syunji Horikawa, Tokyo (JP); Tetsuo Sakurai, Ichihara (JP)

(73) Assignee: Showa Denko K.K., Tokyo (JP)

( * ) Notice: Subject to any disclaimer, the term of this patent is extended or adjusted under 35 U.S.C. 154(b) by 698 days.

(21) Appl. No.: 10/585,744

(22) PCT Filed: Apr. 27, 2005

(86) PCT No.: PCT/JP2005/008461

§ 371 (c)(1),
(2), (4) Date: Jul. 12, 2006

(87) PCT Pub. No.: WO2005/104251

PCT Pub. Date: Nov. 3, 2005

(65) Prior Publication Data

US 2008/0230800 A1    Sep. 25, 2008

Related U.S. Application Data

(60) Provisional application No. 60/570,135, filed on May 12, 2004, provisional application No. 60/585,919, filed on Jul. 8, 2004.

(30) Foreign Application Priority Data

| Apr. 27, 2004 | (JP) | ............................. 2004-131617 |
| May 24, 2004 | (JP) | ............................. 2004-153709 |
| Jun. 3, 2004 | (JP) | ............................. 2004-165406 |
| Jun. 30, 2004 | (JP) | ............................. 2004-193744 |
| Jul. 21, 2004 | (JP) | ............................. 2004-213423 |
| Feb. 8, 2005 | (JP) | ............................. 2005-031374 |

(51) Int. Cl.
*H01L 33/00* (2010.01)
*H01L 21/00* (2010.01)

(52) U.S. Cl. .................... 257/79; 257/13; 257/E33.008; 438/46

(58) Field of Classification Search ................. 257/101, 257/102, 103, E33.033, E33.034, 79, 13; 438/46, 47
See application file for complete search history.

(56) References Cited

U.S. PATENT DOCUMENTS 5,129,986 A * 7/1992 Seki et al. ..................... 117/21

(Continued)

FOREIGN PATENT DOCUMENTS

EP    1 063 711 A1    12/2000

(Continued)

*Primary Examiner*—Evan Pert
*Assistant Examiner*—Selim Ahmed
(74) *Attorney, Agent, or Firm*—Sughrue Mion, PLLC

(57) ABSTRACT

An object of the present invention is to provide a low-resistance n-type Group III nitride semiconductor layered structure having excellent flatness and few pits.

The inventive n-type group III nitride semiconductor layered structure comprises a substrate and, stacked on the substrate, an n-type impurity concentration periodic variation layer comprising an n-type impurity atom higher concentration layer and an n-type impurity atom lower concentration layer, said lower concentration layer being stacked on said higher concentration layer.

32 Claims, 2 Drawing Sheets

U.S. PATENT DOCUMENTS

| | | | |
|---|---|---|---|
| 5,862,166 A * | 1/1999 | Anayama | 372/43.01 |
| 6,252,255 B1 | 6/2001 | Ueta et al. | |
| 2003/0010993 A1 | 1/2003 | Nakamura et al. | |
| 2004/0119063 A1 * | 6/2004 | Guo et al. | 257/13 |

FOREIGN PATENT DOCUMENTS

| | | |
|---|---|---|
| JP | 11-191639 A | 7/1999 |
| JP | 11-195812 | 7/1999 |
| JP | 11-204831 | 7/1999 |
| JP | 11-214746 | 8/1999 |
| JP | 11-220172 | 8/1999 |
| JP | 11-330554 A | 11/1999 |
| JP | 2000-82676 A | 3/2000 |
| JP | 2000-156348 A | 6/2000 |
| JP | 2000-232237 A | 8/2000 |
| JP | 2000-286451 A | 10/2000 |
| JP | 2003-12398 A | 1/2003 |
| JP | 2003-17420 A | 1/2003 |
| JP | 2003017420 A * | 1/2003 |

* cited by examiner

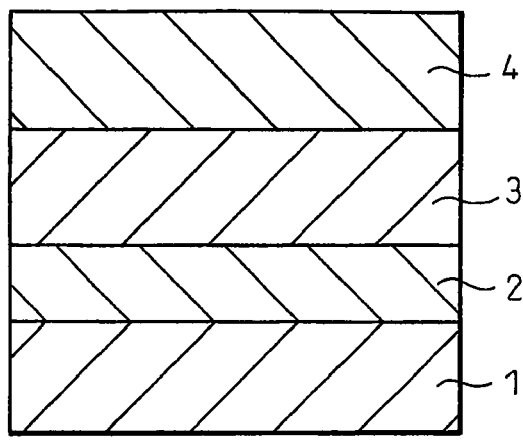
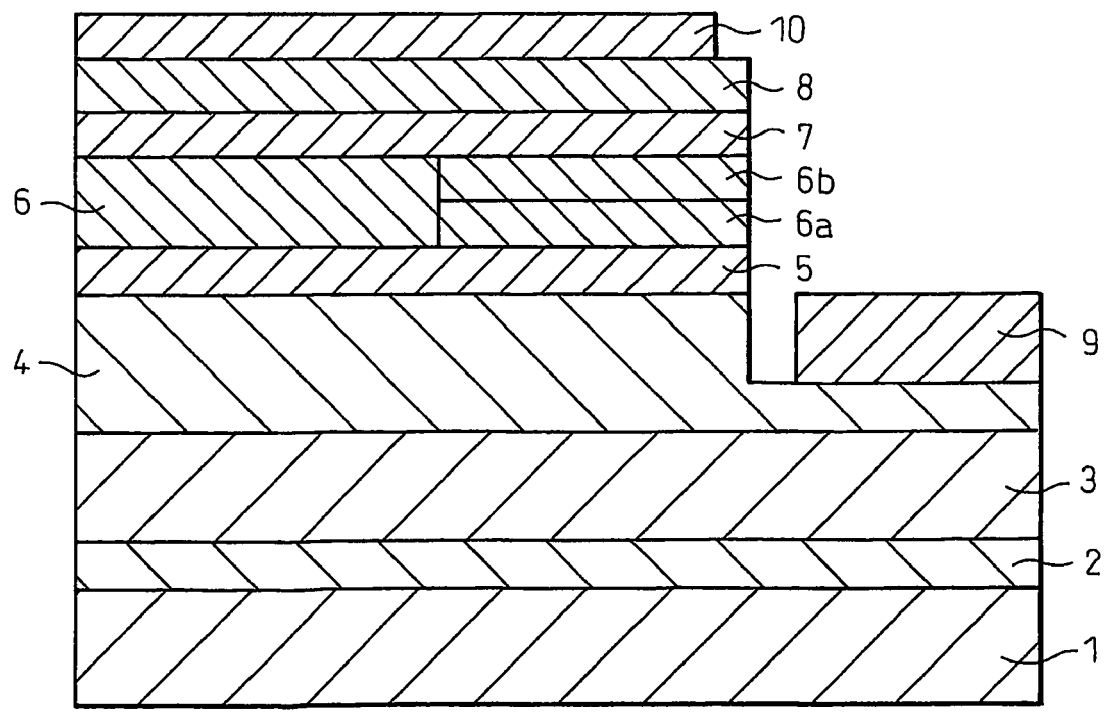

N-TYPE GROUP III NITRIDE SEMICONDUCTOR LAYERED STRUCTURE

CROSS REFERENCE TO RELATED APPLICATIONS

This application is an application filed under 35 U.S.C. §111(a) claiming benefit, pursuant to 35 U.S.C. §119(e)(1), of the filing date of the Provisional Application No. 60/570,135 filed on May 12, 2004 and of the Provisional Application No. 60/585,919 filed on Jul. 8, 2004, pursuant to 35 U.S.C. §111(b).

TECHNICAL FIELD

The present invention relates to a n-type Group III nitride semiconductor layered structure which has, for example, germanium (Ge) as an n-type dopant and to a Group III nitride semiconductor light-emitting device including the semiconductor layered structure.

BACKGROUND ART

Conventionally, a Group III nitride semiconductor formed on a substrate has been used as a functional material for fabricating pn-junction Group III nitride semiconductor light-emitting devices which emit visible light of short wavelength such as light-emitting diodes (LEDs) and laser diodes (LDs) (see, for example, Japanese Patent Application Laid-Open (kokai) No. 2000-332364). For example, in fabrication of an LED emitting near-UV light, blue light, or green light, n-type or p-type aluminum gallium nitride ($Al_XGa_YN$, $0 \leq X$, $Y \leq 1$, $X+Y=1$) is employed for forming a cladding layer (see, for example, Japanese Patent Application Laid-Open (kokai) No. 2003-229645). Similarly, gallium indium nitride ($Ga_YIn_ZN$, $0 \leq Y$, $Z \leq 1$, $Y+Z=1$) is employed for fabricating a light-emitting layer (see, for example, Japanese Patent Publication (kokoku) No. 55-3834).

Generally, in conventional Group III nitride semiconductor light-emitting devices, an n-type or a p-type Group III nitride semiconductor layer serving as a cladding layer is joined to a light-emitting layer, in order to fabricate a light-emitting member having a hetero-junction structure for attaining high emission intensity. For example, in order to fabricate a light-emitting member having a doublehetero-junction structure, the light-emitting layer is composed of a semiconductor such as $Ga_YIn_ZN$ ($0 \leq Y$, $Z \leq 1$, $Y+Z=1$), to which an n-type or a p-type Group III nitride semiconductor layer serving as a cladding layer is joined (see, for example, a book written and edited by Isamu AKASAKI, "Group III-V Compound Semiconductors," published Baifukan Co., Ltd., Chapter 13, May 20 (1995)).

Conventionally, an n-type Group III nitride semiconductor layer interposed between, for example, a substrate and a light-emitting layer, is usually formed from a silicon (Si)-doped Group III nitride semiconductor. In this connection, a semiconductor layer; for example, an Si-doped n-type $Al_XGa_YN$ ($0 \leq X$, $Y \leq 1$, $X+Y=1$) layer having a resistivity controlled through modification of the amount of silicon (Si) as a dopant, is employed (see, for example, Japanese Patent No. 3383242).

However, when a large amount of silicon is added during vapor growth of a low-resistive n-type Group III nitride semiconductor layer, problematic cracks are generated in the layer. In other words, even when conventional technical means; i.e., doping with silicon, is employed, a low-resistive and continuous n-type Group III nitride semiconductor layer has not been reliably obtained.

Further, in the case where Si is used as a dopant, it is reported that highly efficient LED can be produced by stacking an n-type contact layer for n-type electrode formation onto a layer having a lower carrier concentration than the n-type contact layer (see, for example, Japanese Patent Application Laid-Open (kokai) No. 9-129920).

An LED in which Si has been doped into the n-type layer, however, has a problem that, due to the movement of Si within the semiconductor crystal by energization for a long period of time, the emission intensity is lowered after aging. Further, in some cases, a peak inverse voltage reduction phenomenon is observed. The highly efficient LED described in the above Japanese Patent No. 3383242 suffers from the same problems.

Meanwhile, in addition to silicon, germanium (Ge) is known to be an n-type impurity element (see, for example, Japanese Patent Application Laid-Open (kokai) No. 4-170397). As compared with silicon, germanium (Ge) has poor doping efficiency and, therefore, use of germanium as a dopant is disadvantageous for producing a low-resistive n-type Group III nitride semiconductor layer. When Ge is added in a high concentration so as to produce a low-resistive n-type Group III nitride semiconductor layer, pits that impair flatness of the surface of the n-type Group III nitride semiconductor layer are generated, which is problematic.

Further, in the conventional group III nitride semiconductor light-emitting device, in many cases, the substrate is a sapphire substrate. In this connection, a technique for improving light emission characteristics by two-stage growth through a buffer layer is disclosed in which the angle of the surface of the sapphire substrate to C plane (0001) is brought to 5 degrees or less (see Japanese Patent Application Laid-Open (kokai) No. 9-23026). In this Japanese Patent Application Laid-Open (kokai) No. 9-23026, however, only a technique for improving brightness in the light-emitting device (LED) is disclosed, and any technique for improving the flatness and specularity of a crystal surface, which affects a device formation process and the characteristics of a light-emitting device, is not disclosed. When the angle of inclination of the surface of the substrate is simply brought to not more than 5 degrees, as the step density of the surface of the substrate is not satisfactorily specified, the problem of non-uniform dopant distribution and the problem of lowered surface flatness cannot be solved.

DISCLOSURE OF INVENTION

An object of the present invention is to provide a low-resistance n-type Group III nitride semiconductor layered structure having excellent flatness and few pits. Another object of the invention is to provide, from the semiconductor layered structure, a Group III nitride semiconductor light-emitting device exhibiting low forward voltage and high emission efficiency.

Further, another object of the invention is to Provide a group III nitride semiconductor light-emitting device in which light emission characteristics are excellent and a change in characteristics such as a lowering in emission intensity and a reduction in peak inverse voltage caused by aging is very small.

The present invention provides the following.

(1) An n-type group III nitride semiconductor layered structure comprising a substrate and, stacked on the substrate, an n-type impurity concentration periodic variation layer comprising an n-type impurity atom higher concentration layer and an n-type impurity atom lower concentration layer, said lower concentration layer being stacked on said higher concentration layer.

(2) The n-type group III nitride semiconductor layered structure according to the above item 1, wherein said n-type impurity atom is one element or a combination of at least two elements selected from the group consisting of silicon (Si), germanium (Ge), sulfur (S), selenium (Se), tin (Sn), and tellurium (Te).

(3) The n-type group III nitride semiconductor layered structure according to the above item 2, wherein said n-type impurity atom is Ge.

(4) The n-type group III nitride semiconductor layered structure according to any one of the above items 1 to 3, wherein pits are provided on a surface of the higher concentration layer (a surface remote from the substrate).

(5) The n-type group III nitride semiconductor layered structure according to the above item 4, wherein the number of pits formed is in the range of $1\times10^5/cm^2$ to $1\times10^{10}/cm^2$.

(6) The n-type group III nitride semiconductor layered structure according to any one of the above items 1 to 5, wherein the flatness (Ra) of the surface of the lower concentration layer (a surface remote from the substrate) is not more than 10 angstroms.

(7) The n-type group III nitride semiconductor layered structure according to any one of the above items 1 to 6, wherein the higher concentration layer and the lower concentration layer are provided in an alternate and periodic manner.

(8) The n-type group III nitride semiconductor layered structure according to any one of the above items 1 to 7, wherein the thickness of the higher concentration layer and the thickness of the lower concentration layer each are 0.5 to 500 nm.

(9) The n-type group III nitride semiconductor layered structure according to any one of the above items 1 to 8, wherein the thickness of the lower concentration layer is equal to or larger than the thickness of the higher concentration layer.

(10) The n-type group III nitride semiconductor layered structure according to any one of the above items 7 to 9, wherein the repetition number of said higher concentration layer and said lower concentration layer is 10 to 1000.

(11) The n-type group III nitride semiconductor layered structure according to any one of the above items 1 to 10, wherein the thickness of the n-type impurity concentration periodic variation layer is 0.1 to 10 μm.

(12) The n-type group III nitride semiconductor layered structure according to any one of the above items 1 to 11, wherein the concentration of the n-type impurity in the higher concentration layer is $5\times10^{17}$ to $5\times10^{19}$ cm$^{-3}$.

(13) The n-type group III nitride semiconductor layered structure according to any one of the above items 1 to 12, wherein the concentration of the n-type impurity in the lower concentration layer is lower than the concentration of the n-type impurity in the higher concentration layer and is not more than $2\times10^{19}$ cm$^{-3}$.

(14) The n-type group III nitride semiconductor layered structure according to the above item 13, wherein the n-type impurity is not intentionally doped into the lower concentration layer.

(15) The n-type group III nitride semiconductor layered structure according to any one of the above items 1 to 14, which comprises a base layer, having a lower carrier concentration than the n-type impurity concentration periodic variation layer, between said substrate and said n-type impurity concentration periodic variation layer.

(16) The n-type group III nitride semiconductor layered structure according to the above item 15, wherein said base layer contains an n-type impurity as a dopant and the concentration of the n-type impurity is not more than $5\times10^{18}$ cm$^{-3}$.

(17) The n-type group III nitride semiconductor layered structure according to the above item 15, wherein said base layer is undoped.

(18) The n-type group III nitride semiconductor layered structure according to any one of the above items 15 to 17, wherein the thickness of the base layer is not less than 1 μm and not more than 20 μm.

(19) The n-type group III nitride semiconductor layered structure according to the above item 18, wherein the thickness of the base layer is not less than 5 μm and not more than 15 μm.

(20) The n-type group III nitride semiconductor layered structure according to any one of the above items 15 to 19, wherein the carrier concentration of the base layer is not more than $5\times10^{17}$ cm$^{-3}$.

(21) The n-type group III nitride semiconductor layered structure according to any one of the above items 1 to 20, wherein the plane direction of the surface of the substrate is slightly inclined with respect to the just direction.

(22) The n-type group III nitride semiconductor layered structure according to the above item 21, wherein the plane direction of the surface of the substrate is inclined by 0.05 to 0.6 degree with respect to the just direction.

(23) The n-type group III nitride semiconductor layered structure according to the above item 21 or 22, wherein said substrate is selected from the group consisting of oxide single crystal materials such as sapphire ($\alpha$-Al$_2$O$_3$ single crystal), zinc oxide (ZnO), and gallium lithium oxide (LiGaO$_2$), group IV semiconductor single crystals including silicon (Si) single crystals (silicon) and cubic or hexagonal silicon carbide (SiC), and group III-V compound semiconductor single crystals including gallium phosphide (GaP), gallium arsenide (GaAs), and gallium nitride (GaN).

(24) A process for producing a n-type group III nitride semiconductor layered structure according to any one of the above items 1 to 23, wherein each of said n-type impurity atom higher concentration layer and said n-type impurity atom lower concentration layer is stacked so that, in addition to the concentration of the n-type impurity to be doped, conditions for growth within a reactor are also differentiated.

(25) The process according to the above item 24, wherein conditions for growth of the lower concentration layer are differentiated from conditions for growth of the higher concentration layer so that two-dimensional growth of the layer is accelerated during the growth of the lower concentration layer.

(26) The process according to the above item 24 or 25, wherein the lower concentration layer is grown at a temperature different from the temperature at which the higher concentration layer is grown.

(27) The process according to the above item 26, wherein the lower concentration layer is grown at a temperature above the temperature at which the higher concentration layer is grown.

(28) The process according to any one of the above items 24 to 27, wherein the lower concentration layer is grown at a pressure different from the pressure at which the higher concentration layer is grown.

(29) The process according to the above item 28, wherein the lower concentration layer is grown at a pressure lower than the pressure at which the higher concentration layer is grown.

(30) The process according to any one of the above items 24 to 29, wherein the carrier gas flow rate in the growth of the lower concentration layer is different from the carrier gas flow rate in the growth of the higher concentration layer.

(31) The process according to the above item 30, wherein the carrier gas flow rate in the growth of the lower concentration layer is higher than the carrier gas flow rate in the growth of the higher concentration layer.

(32) The process according to any one of the above items 24 to 31, wherein the growth speed of the lower concentration layer is different from the growth speed of the higher concentration layer.

(33) The process according to the above item 32, wherein the growth speed of the lower concentration layer is lower than the growth speed of the higher concentration layer.

(34) The process according to any one of the above items 24 to 33, wherein the nitrogen/III ratio in the growth of the lower concentration layer is different from the nitrogen/III ratio in the growth of the higher concentration layer.

(35) The process according to the above item 34, wherein the nitrogen/III ratio in the growth of the lower concentration layer is lower than the nitrogen/III ratio in the growth of the n-type impurity atom higher concentration layer.

(36) A group III nitride semiconductor light-emitting device comprising a light-emitting layer composed of a group III nitride semiconductor provided on the substrate, wherein the n-type group III nitride semiconductor layered structure according to any one of the above items 1 to 23 is provided between the substrate and the light-emitting layer.

The n-type Group III nitride semiconductor layered structure of the present invention exhibits low resistance and high flatness, since pits formed in the low-resistive n-type impurity atom higher concentration layer are filled up with a portion of the n-type impurity atom lower concentration layer. Therefore, the light-emitting device of the present invention including such an n-type Group III nitride semiconductor layered structure exhibits low forward voltage and excellent emission efficiency.

The utilization of the n-type group III nitride semiconductor layered structure according to the present invention in the n-type contact layer in the light-emitting device is particularly effective. Specifically, this is advantageous in that the resistance is low and, at the same time, as compared with the case where film formation is carried out with doping without providing any concentration difference, the surface flatness is superior and, thus, the crystallinity of the light-emitting layer overlying the film is not deteriorated. Further, fine pit formation on the dried etched surface lowers the resistance of contact with the electrode.

Further, according to the present invention, a group III nitride semiconductor light-emitting device is provided in which light emission characteristics are excellent and a change in characteristics such as a lowering in emission intensity and a reduction in peak inverse voltage caused by aging is very small.

BRIEF DESCRIPTION OF DRAWINGS

FIG. 2 is schematic cross-section of a stacked structure fabricated in Example 1.

FIG. 3 is schematic cross-section of a Group III nitride semiconductor light-emitting device fabricated in Example 4.

BEST MODES FOR CARRYING OUT THE INVENTION

Figure 1:
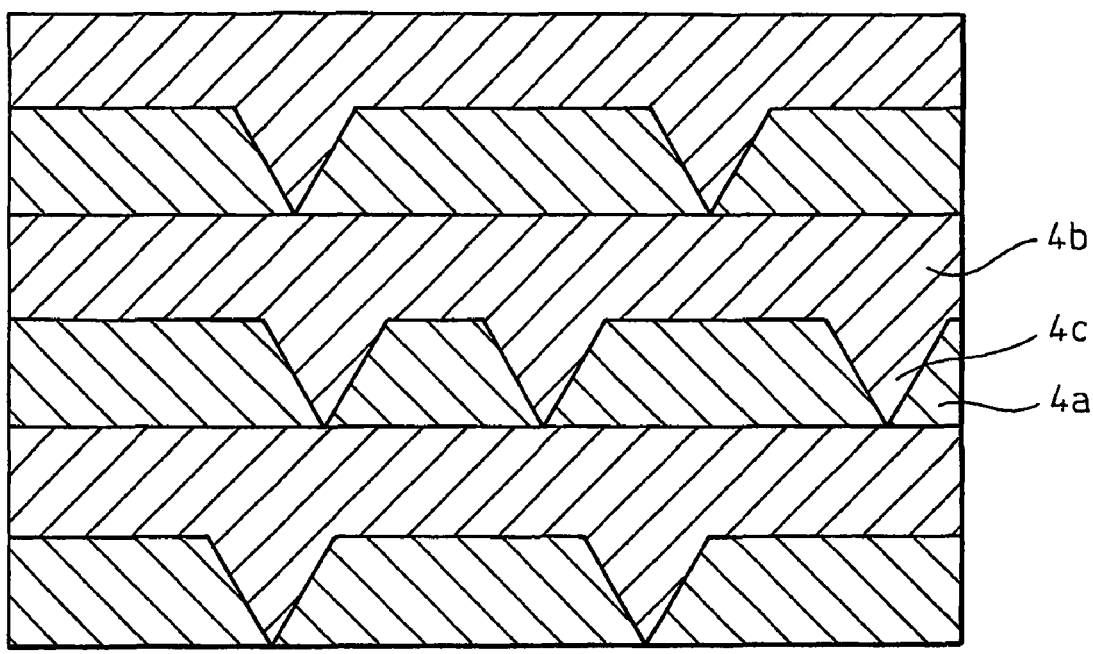
FIG. 1 is a conceptual cross-sectional view of a layered structure according to the present invention in which pits produced in the n-type impurity atom higher concentration layer is filled up with a portion of the n-type impurity atom lower concentration layer.

In the present invention, the substrate on which a Group III nitride semiconductor layer is stacked may have a comparatively high melting point (i.e., high heat resistance). Examples of the material of the substrate include oxide single crystal materials such as sapphire ($\alpha$-$Al_2O_3$ single crystal), zinc oxide (ZnO), and gallium lithium oxide ($LiGaO_2$), and Group IV semiconductor single crystals such as a silicon single crystal and cubic or hexagonal silicon carbide (SiC). Alternatively, a group III-V compound semiconductor single crystal material such as gallium phosphide (GaP), gallium arsenide (GaAs) and gallium nitride (GaN) may also be employed as a substrate material. An optically transparent single-crystal material, through which light emitted from the light-emitting layer can be transmitted, is advantageously employed for a substrate material. Among them, sapphire is preferred.

In the present invention, an n-type impurity concentration periodic variation layer stacked on a substrate, the n-type impurity concentration periodic variation layer comprising an n-type impurity atom higher concentration layer and an n-type impurity atom lower concentration layer, is included in the layered semiconductor. Preferably, the n-type impurity concentration periodic variation layer is formed on a mirror polished crystal substrate, the plane direction of which has been slightly inclined with respect to the just direction. In the group III nitride semiconductor, the group IV element showing doping-derived n-type conduction, such as Si and Ge, is considered to be present in the crystal by replacement of the group III element with the group IV element. Further, it is considered that growth on a mirror polished substrate, of which the plane direction has been slightly inclined with respect to the just direction, causes the n-type impurity to be replaced with the group III element in the crystal at the kink part during the growth of crystal corresponding to the step of the substrate. By virtue of this, advantageously, the n-type impurity is uniformly distributed, the crystal surface is specular, and, further, the emission intensity of LED is increased.

Regarding the orientation of the inclined specular polished crystal substrate, inclination of 0.01 to 2 degrees, preferably 0.02 to 1 degree, more preferably 0.05 to 0.6 degree, most preferably 0.2 to 0.5 degree, with respect to the just direction is suitable. When the substrate is a hexagonal crystal-type sapphire ($\alpha$-$Al_2O_3$ single crystal) and silicon carbide (SiC), inclination of 0.01 to 2 degrees, preferably 0.02 to 1 degree, more preferably 0.05 to 0.6 degree, most preferably 0.2 to 0.5 degree, with respect to the just direction <0001> is suitable. However, the present invention is not limited to these only.

The n-type Group III nitride semiconductor layered structure of the present invention is formed from a Group III nitride semiconductor represented by a formula: $Al_XGa_YIn_ZN_{1-a}M_a$ ($0 \leq X \leq 1$, $0 \leq Y \leq 1$, $0 \leq Z \leq 1$, $X+Y+Z=1$, and $0 \leq a < 1$, wherein M represents a non-nitrogen Group V element). When the substrate is lattice-mismatched with the Group III nitride semiconductor layer formed thereon, the layer is preferably stacked with the mediation of a low-temperature buffer layer or a high-temperature buffer layer which mitigates mismatch and provides a Group III nitride semiconductor layer of high crystallinity. Such a buffer layer may be composed of aluminum gallium nitride ($Al_XGa_YIn_ZN$: $0 \leq X, Y, Z \leq 1$, $X+Y+Z=1$).

The Group III nitride semiconductor layer having the aforementioned composition may be formed through vapor phase growth means such as metal organic chemical vapor deposition (abbreviated as (MOCVD, MOVPE, or OMVPE)), molecular beam epitaxy (MBE), halogen vapor phase growth, or hydride vapor phase growth. Among these methods, MOCVD is preferably employed.

In MOCVD, hydrogen ($H_2$) or nitrogen ($N_2$) is employed as a carrier gas, trimethylgallium (TMG) or triethylgallium (TEG) is employed as a Ga source (Group V element source), trimethylaluminum (TMA) or triethylaluminum (TEA) is employed as an Al source, trimethylindium (TMI) or triethylindium (TEI) is employed as an In source, and ammonia ($NH_3$), hydrazine ($N_2H_4$), or the like is employed as a nitrogen source.

The n-type impurity atom used in the present invention is preferably one element or a combination of two or more elements selected from the group consisting of silicon (Si), germanium (Ge), sulfur (S), selenium (Se), tin (Sn), and tellurium (Te). Among these, the use of Ge is preferred.

As compared with Si, Ge is less likely to be diffused in the semiconductor crystal. Accordingly, when a device structure is prepared using Ge as an impurity, the interface of the doped layer and the non-doped layer can be made steep. Further, advantageously, the steepness of the interface is not deteriorated even by aging and the like.

Starting materials usable for n-type impurities include hydrides of the elements, for example, monosilane ($SiH_4$), disilane ($SiH_6$), germane ($GeH_4$), hydrogen sulfide ($H_2S$), hydrogen selenide ($H_2Se$), hydrogen telluride ($H_2Te$) and the like and organic compounds of these elements, for example, tetramethylsilicon (($CH_3$)$_4$Si), tetraethylsilicon (($C_2H_5$)$_4$Si), tetramethylgermanium (($CH_3$)$_4$Ge), tetraethylgermanium (($C_2H_5$)$_4$Ge), diethylselenium (($C_2H_5$)$_2$Se), diisopropylselenium (($C_3H_7$)$_2$Se), diethylsulfide (($C_2H_5$)$_2$S), diisopropylsulfide (($C_3H_7$)$_2$S), tetramethyltin (($CH_3$)$_4$Sn), tetraethyltin (($C_2H_5$)$_4$Sn), dimethyltellurium (($CH_3$)$_2$Te), and diethyltellurium (($C_2H_5$)$_2$Te). In particular, ($CH_3$)$_4$Ge is preferred as a germanium source. In the MBE process, elemental germanium can also be utilized as a doping source.

When MOCVD is employed, preferably, a Group III nitride semiconductor layer of interest is grown from the aforementioned growth sources at 900° C. to 1,250° C. on a substrate.

The n-type impurity atom higher concentration layer and the n-type impurity atom lower concentration layer are formed through modification of the amount of an n-type dopant source supplied to the vapor growth reaction system during growth of a Group III nitride semiconductor layer. In an exemplary procedure, a large amount of a Ge dopant source is instantly supplied to the vapor growth reaction system, thereby forming a high-Ge-atom-concentration layer and subsequently, an undoped layer (i.e., a layer having a Ge atom concentration of 0) is formed without feeding the Ge dopant source into the vapor growth reaction system. In an alternative procedure, after completion of the growth of a high-Ge-atom-concentration layer, the growth is intermitted, and a low-Ge-atom-concentration layer is grown under re-regulated growth conditions (e.g., V/III source ratio) suitable for forming a low-Ge-atom-concentration layer.

Through modification of the amount of the n-type dopant source supplied to the vapor growth reaction system in a time-dependent manner, thin layers each having a specific n-type impurity atom concentration are alternatingly and periodically stacked. The n-type impurity concentration periodic variation layer of the present invention composed of an n-type impurity atom higher concentration layer and an n-type impurity atom lower concentration layer preferably has a structure in which a thin n-type impurity atom higher concentration layer and a thin n-type impurity atom lower concentration layer are alternatingly and periodically stacked.

In the above structure, each thin n-type impurity atom higher concentration layer suitably has a thickness of 0.5 nm to 500 nm, preferably 2 nm to 200 nm, more preferably 3 nm to 50 nm. When the thickness is less than 0.5 nm, the amount of n-type dopant in the n-type impurity concentration periodic variation layer is insufficient, to increase the resistance, whereas when the thickness is greater than 500 nm, pits generated in the higher concentration layer cannot completely be filled up with a portion of the lower concentration layer, resulting in poor flatness. When the thickness of the lower concentration layer is increased sufficiently for filling up pits, resistance of the n-type impurity concentration periodic variation layer increases.

Similar to the thin n-type impurity atom higher concentration layer, each thin n-type impurity atom lower concentration layer preferably has a thickness of 0.5 nm to 500 nm, more preferably 2 nm to 200 nm, particularly preferably 3 nm to 50 nm. When the thickness is less than 0.5 nm, pits generated in the higher concentration layer cannot completely be filled up with a portion of the lower concentration layer, resulting in poor flatness, whereas when the thickness is greater than 500 nm, the resistance of the n-type impurity concentration periodic variation layer increases, which is disadvantageous for producing a Group III nitride semiconductor light-emitting device exhibiting low forward voltage (Vf) or threshold voltage (Vth).

In the present invention, a unit consisting of a higher concentration layer and a lower concentration layer which are in contact with each other is referred to as a repetition cycle. In a repetition cycle, the sum of the thickness of the higher concentration layer and that of the lower concentration layer; i.e., the thickness of a repetition cycle, is suitably 1 nm to 1,000 nm, preferably 4 nm to 400 nm, more preferably 6 nm to 100 nm. When the thickness is more than 1,000 nm, pit formation fails to be prevented, or resistance of the n-type impurity concentration periodic variation layer increases. When the total thickness is less than 1 nm, the supply amount of n-type dopant source must be frequently modified, thereby lowering operation efficiency.

When the higher concentration layer is thicker than the lower concentration layer in a single repetition cycle, pit formation cannot be prevented sufficiently and satisfactory flatness fails to be attained, whereas when the lower concentration layer has a thickness equal to or greater than that of the higher concentration layer in a single repetition cycle, high flatness can be attained. Therefore, the lower concentration layer preferably has a thickness not less than that of the higher concentration layer.

The n-type impurity concentration periodic variation layer preferably has a thickness of 0.1 μm to 10 μm, more preferably 0.3 μm to 5 μm, particularly preferably 0.5 μm to 3 μm. When the layer thickness is less than 0.1 μm, the produced light-emitting device exhibits high forward voltage, whereas when the thickness is more than 10 μm, an effect commensurate to the increase cannot be attained, thereby merely increasing cost.

In consideration of the thickness of a single repetition cycle and the thickness of the n-type impurity concentration periodic variation layer, the number of stacked repetition cycles is preferably 1 to 10,000, more preferably 10 to 1,000, particularly preferably 20 to 200. For example, a unit (repetition cycle) consisting of a higher concentration layer (thickness: 10 nm) and a lower concentration layer (thickness: 10 nm) is stacked 100 times, thereby forming an n-type impurity concentration periodic variation layer having a thickness of 2 μm.

The higher concentration layer preferably has an n-type impurity atom concentration of $5 \times 10^{17}$ cm$^{-3}$ to $5 \times 10^{19}$ cm$^{-3}$, more preferably $1 \times 10^{18}$ cm$^{-3}$ to $3 \times 10^{19}$ cm$^{-3}$, particularly preferably $3 \times 10^{18}$ cm$^{-3}$ to $2 \times 10^{19}$ cm$^{-3}$. When the concentration is lower than $5 \times 10^{17}$ cm$^{-3}$, resistance of the n-type impurity concentration periodic variation layer increases, and production of an LED exhibiting low forward voltage becomes difficult. When the n-type impurity atom concentration is more than $5 \times 10^{19}$ cm$^{-3}$, surface pit density steeply increases, which is not preferred. The n-type impurity atom concentration of the higher concentration layer is not necessarily uniform in the entire n-type impurity concentration periodic variation layer, and the concentration may vary cycle by cycle continuously or discretely. In addition, a single thin layer may have variation in n-type impurity atom concentration.

Preferably, the lower concentration layer has an n-type impurity atom concentration which is lower than that of the higher concentration layer and which is equal to or less than $2 \times 10^{19}$ cm$^{-3}$. When the n-type impurity atom concentration is in excess of $2 \times 10^{19}$ cm$^{-3}$, surface pit density steeply increases, which is not preferred. Thus, the n-type impurity atom concentration is more preferably $1 \times 10^{19}$ cm$^{-3}$ or less, particularly preferably $5 \times 10^{18}$ cm$^{-3}$ or less. Preferably, the lower limit of the concentration is as low as possible, and the lower concentration layer is not intentionally doped with n-type impurity atom. When the lower concentration layer is formed of an undoped Group III nitride semiconductor layer so as to further decrease the n-type impurity atom concentration, the effect of filling up pits generated on the surface of the higher concentration layer is further enhanced, which is preferred for producing an n-type semiconductor layer having a flat surface. Note that when the lower concentration layer has a lower n-type impurity atom concentration, the thickness of the lower concentration layer is preferably reduced.

Similar to the higher concentration layer, the n-type impurity atom concentration of the lower concentration layer is not necessarily uniform in the entire n-type impurity concentration periodic variation layer, and the concentration may vary cycle by cycle continuously or discretely. In addition, a single thin layer may have a variation in n-type impurity atom concentration.

In the process for producing the above-described higher concentration layer and lower concentration layer, conditions for growth of the higher concentration layer can be differentiated from conditions for growth of the lower concentration layer to prepare a semiconductor having good crystallinity. For crystallinity improvement purposes, conditions for growth of the lower concentration layer are preferably such that two-dimensional growth is accelerated. It is important that conditions for growth which enables the control of such a growth mode are varied.

Conditions for growth for controlling the growth mode of the group III nitride semiconductor crystal include growth temperature, growth pressure, carrier gas flow rate, growth rate, and V/III ratio. Only one of these conditions may be changed, or alternatively several parameters thereof may be simultaneously changed.

Preferably, the higher concentration layer is grown at a growth temperature different from that of the lower concentration layer. In particular, the adoption of the growth temperature of the lower concentration layer above the growth temperature of the higher concentration layer can accelerate the two-dimensional growth by the lower concentration layer to effectively fill up pits generated in the higher concentration layer.

The difference in growth temperature between the higher concentration layer and the lower concentration layer is preferably 5° C. or above and 100° C. or below. More preferably, the growth temperature difference is 10° C. or above and 50° C. or below. When the temperature difference is less than 5° C., in some cases, no satisfactory effect can be attained. On the other hand, when the temperature difference is more than 100° C., in some cases, the process time is increased due to interval times or the like.

The growth temperature may be varied in the course of growth of the higher concentration layer or the lower concentration layer. Alternatively, the growth may be stopped until the temperature becomes stable.

Preferably, the lower concentration layer is grown at a pressure different from the pressure at which the higher concentration layer is grown. In particular, when the growth pressure of the lower concentration layer is made lower than the growth pressure of the higher concentration layer, the two-dimensional growth of the lower concentration layer can be accelerated to effectively fill up pits produced in the higher concentration layer.

The difference in growth pressure between the higher concentration layer and the lower concentration layer is preferably 50 mbar or more and is 500 mbar or less, more preferably 100 mbar or more and 400 mbar or less. When the pressure difference is less 50 mbar, in some cases, satisfactory effect cannot be attained. When the pressure difference is more than 500 mbar, in some cases, the process time is increased, for example, due to the interval time.

The growth pressure may be varied in the course of growth of the higher concentration layer or the lower concentration layer. Alternatively, the growth may be stopped until the pressure becomes stable.

The flow rate of the carrier gas for the lower concentration layer is preferably differentiated from the flow rate of the carrier gas for the higher concentration layer. In particular, when the flow rate of the carrier gas for the lower concentration layer is larger than the flow rate of the carrier gas for the higher concentration layer, the two-dimensional growth of the lower concentration layer can be accelerated to effectively fill up pits produced in the higher concentration layer.

The flow rate of the carrier gas for the lower concentration layer is preferably 1.2 to 10 times, more preferably 1.5 to 5 times, as compared with the flow rate of the carrier gas for the higher concentration layer. When the flow rate difference is less than 1.2 times, in some cases, satisfactory effect cannot be attained. On the other hand, when the flow rate difference is more than 10 times, in some cases, the process time is wastefully increased due to the interval time and the like.

The flow rate of the carrier gas may be varied in the course of growth of the higher concentration layer or the lower concentration layer. Alternatively, the growth may be stopped until the flow rate of the carrier gas becomes stable.

Preferably, the lower concentration layer is grown at a growth rate different from the growth rate at which the higher concentration layer is grown. In particular, when the growth rate of the lower concentration layer is made lower than the growth rate of the higher concentration layer, the two-dimensional growth of the lower concentration layer can be accelerated to effectively fill up pits produced in the higher concentration layer.

The growth rate of the higher concentration layer is preferably 1.2 to 10 times, more preferably 1.5 to 5 times, as compared with the growth rate of the lower concentration layer. When the growth rate difference is less than 1.2 times, in some cases, satisfactory effect cannot be attained. On the other hand, when the growth rate difference is more than 10 times, in some cases, there is no significant difference in effect between not less than 10 times and not more than 10 times.

The growth rate may be varied in the course of growth of the higher concentration layer or the lower concentration layer. Alternatively, the growth may be stopped until the growth rate becomes stable.

In general, the growth rate can be varied by varying the feed rate of the group V (nitrogen) material or by varying the feed rate of the group III material. In the case of the group III nitride semiconductor crystal, it is common practice to vary the growth rate by varying the feed rate of the group III material.

Preferably, the V/III ratio in the growth of the lower concentration layer is differentiated from the V/III ratio in the growth of the higher concentration layer. In particular, when the V/III ratio in the growth of the lower concentration layer is smaller than the V/III ratio in the growth of the higher concentration layer, the two-dimensional growth of the lower concentration layer can be accelerated to effectively fill up pits produced in the higher concentration layer.

The V/III ratio in the growth of the higher concentration layer is preferably 1.2 to 10 times, more preferably 1.5 to 5 times, as compared with the V/III ratio in the growth of the lower concentration layer. When the V/III ratio difference is less than 1.2 times, in some cases, satisfactory effect cannot be attained. On the other hand, when the V/III ratio difference is more than 10 times, in some cases, there is no significant difference in effect between not less than 10 times and not more than 10 times.

The V/III ratio may be varied in the course of growth of the higher concentration layer or the lower concentration layer. Alternatively, the growth may be stopped until the V/III ratio becomes stable.

In general, the V/III ratio in the growth can be varied by varying the feed rate of the group V material or by varying the feed rate of the group III material. In the present invention, preferably, the control of the V/III ratio in the growth is carried out by varying the feed rate of the group V material.

The n-type impurity atom concentration may be determined through, for example, secondary ion mass spectrometry (SIMS), which is a technique including irradiating a surface of a sample with a primary ion beam and analyzing the released ionized elements through mass analysis. The technique enables quantification of a specific element and observation of a concentration distribution profile of the element in the depth direction. The n-type impurity atom present in the Group III nitride semiconductor layer is effectively quantified through the technique. In the analysis, the thickness of each layer can be also calculated.

The carrier concentration of the n-type impurity concentration periodic variation layer comprising the n-type impurity atom higher concentration layer and the n-type impurity atom lower concentration layer may be measured by regarding the whole structure of higher concentration layers alternating with lower concentration layers as a single layer. In this case, the carrier concentration is approximately an average of values obtained by multiplying the doping amount of the n-type impurity of the higher concentration layer and the lower concentration layer by the ratio of the layer thickness. The carrier concentration may be measured, for example, by measurement of the Hall effect according to the conventional Van de Paw method, as well as by the C-V method.

The carrier concentration of the whole n-type impurity concentration periodic variation layer is preferably in the range of $1 \times 10^{17}$ cm$^{-3}$ to $3 \times 10^{19}$ cm$^{-3}$. Among others, a carrier concentration in the range of $5 \times 10^{17}$ cm$^{-3}$ to $1 \times 10^{19}$ cm$^{-3}$ is convenient for use as the n-type contact layer.

In the present invention, preferably, a base layer having a lower carrier concentration than the n-type impurity concentration periodic variation layer is provided between the substrate and the n-type impurity concentration periodic variation layer. The carrier concentration of the n-type impurity concentration periodic variation layer is an average carrier concentration of the n-type impurity concentration periodic variation layer, and, in the present invention, the carrier concentration may be regarded as being synonymous with the impurity amount.

In the case where a layer for buffering the crystal lattice is provided on a substrate and a nitride semiconductor crystal layer is prepared thereon, a semiconductor crystal layer having better crystallinity can be formed by avoiding high-concentration doping of impurity atoms into the layer in contact with the buffer layer. When a structure of high-concentration doping of an impurity into the layer in contact with the buffer layer is adopted, dislocation is likely to occur in the crystal. Further, pits are sometimes produced depending upon the amount of the impurity.

In the present invention, the carrier concentration of the base layer is smaller than the carrier concentration of the n-type impurity concentration periodic variation layer, and the base layer is preferably formed of light doped GaN of, for example, not more than about $5 \times 10^{18}$ cm$^{-3}$. The carrier concentration of the base layer is more preferably not more than $5 \times 10^{17}$ cm$^{-3}$. When doping is carried out, the n-type impurity is suitable. However, undoping is most preferred. The thickness of the base layer is preferably 1 to 20 µm, more preferably 5 to 15 µm.

When a Group III nitride semiconductor light-emitting device is fabricated from the n-type Group III nitride semiconductor layered structure of the present invention, the n-type Group III nitride semiconductor layered structure may be disposed at any position between the substrate and the light-emitting layer. For example, the semiconductor layered structure may be directly joined to a surface of the substrate or joined to a buffer layer provided on a surface of the substrate. Through provision of a Group III nitride semiconductor layer on the n-type semiconductor layered structure of the present invention, which is closed to the substrate or a layer such as a buffer layer, the provided Group III nitride semiconductor layer exhibits excellent crystallinity. This is because propagation of misfit dislocations and other dislocations induced by lattice mismatch with the substrate to an upper layer can be prevented through provision of the n-type semiconductor layered structure of the present invention.

When the n-type Group III nitride semiconductor layered structure of the present invention has been provided, propagation of dislocations penetrating through a layer under the semiconductor layered structure of the present invention can be prevented. Therefore, the light-emitting layer formed on the n-type Group III nitride semiconductor layered structure of the present invention exhibits excellent crystallinity, whereby a Group III nitride semiconductor light-emitting device exhibiting high emission efficiency can be produced.

When the group III nitride semiconductor light-emitting device is prepared using the n-type group III nitride semiconductor layered structure according to the present invention, the utilization of the n-type impurity concentration periodic variation layer as the n-type contact layer in the group III nitride semiconductor light-emitting device is particularly effective. That is, despite the fact that the dopant concentration is high enough to produce pits on the surface, a flat surface can be realized and, thus, an n-type semiconductor crystal film having a very low level of resistance can be formed.

In the n-type impurity atom higher concentration layer used in the technique proposed in the present invention, when the n-type impurity is used as the dopant, the concentration thereof is high enough to produce pits on the surface. When this is filled up with a portion of the n-type impurity atom lower concentration layer, as compared with high-concentration doping of the n-type impurity by the conventional method, a flatter surface can be realized. Specifically, in the present invention, in the interface of the higher concentration layer and the lower concentration layer, the surface on the higher concentration layer side (remote from the substrate) contains pits in a concave form, but on the other hand, the surface on the lower concentration layer side (remote from the substrate) is flat.

FIG. 1 is a conceptual cross-sectional view of a layered structure according to the present invention in which pits produced in the n-type impurity atom higher concentration layer is filled up with a portion of the n-type impurity atom lower concentration layer. In the drawing, numeral 4a denotes an n-type impurity atom higher concentration layer, and numeral 4c pits. Numeral 4b denotes an n-type impurity atom lower concentration layer. The pits 4c produced on the surface of the higher concentration layer 4a are filled up with a portion of the lower concentration layer 4b to render the surface of the lower concentration layer 4b flat.

The pits produced in the n-type impurity atom higher concentration layer according to the present invention are considered to be produced at positions of the so-called "through dislocation" produced from the interface of the substrate and the group III nitride semiconductor layer. Therefore, in many cases, the density of pits produced in the higher concentration layer is approximately identical to the density of through dislocation in the base layer. In GaN crystal on a conventional sapphire substrate, the through dislocation of the base layer is in the range of $1 \times 10^7/cm^2$ to $1 \times 10^{10}/cm^2$. At the present time, a through dislocation density of not more than $1 \times 10^7/cm^2$ is not realized. On the other hand, when the through dislocation density is not less than $1 \times 10^{10}/cm^2$, a satisfactory function cannot be provided in the case where the GaN crystal is used as an electronic device.

The pit density is in the range of $1 \times 10^5/cm^2$ to $1 \times 10^{10}/cm^2$, although it also varies depending upon the through dislocation density of the base layer. In general, the pit density is in the range of $1 \times 10^6/cm^2$ to $1 \times 10^9/cm^2$. When only the higher concentration layer is formed in a thickness of not less than about 10 nm, pits can be observed by means such as atomic force microscopy (AFM). When the layer thickness is increased to about 500 nm, pits can be observed, for example, under an optical microscope. When the thickness of the higher concentration layer is very small, in some cases pits cannot be observed due to the resolution of the atomic force microscopy. Regarding conditions for layer formation, when the thickness is at a certain level so that pits can be observed, it is considered that pits are produced even in a small thickness of less than 10 nm.

The surface of the n-type impurity atom lower concentration layer according to the present invention is preferably flat. The flatness is preferably not more than about 10 angstroms in terms of Ra value, more preferably not more than 5 angstroms.

As in the technique proposed in the present invention, in the case of a layered structure in which pits produced in the n-type impurity atom higher concentration layer have been filled up with a portion of the n-type impurity atom lower concentration layer, it is useful that the layered structure is employed as the n-type contact layer. In the case of the group III nitride semiconductor light-emitting device, for negative electrode preparation, it is common practice to remove a part of the stacked semiconductor layer by dry etching to expose the n-type contact layer. In the layered structure according to the present invention, upon this dry etching, pit-shaped concaves are formed in the n-type contact layer. The concaves increase the surface area of contact with the electrode metal, and the contact resistance is lowered by the anchor effect. Therefore, the drive voltage of the light-emitting device can be on a low level.

No particular limitation is imposed on the light-emitting layer, and any of known light-emitting layers may be employed. Examples of the light-emitting layer composed of a Group III nitride semiconductor include those having a single quantum well structure or a multiple quantum well structure, having a composition represented by $Al_XGa_YIn_ZN_{1-a}M_a$ ($0 \leq X \leq 1$, $0 \leq Y \leq 1$, $0 \leq Z \leq 1$, $X+Y+Z=1$, and $0 \leq a < 1$, wherein M represents a non-nitrogen Group V element). No particular limitation is imposed on the p-type Group III nitride semiconductor for forming a light-emitting member having a double-hetero junction structure, and any of a variety of known semiconductors doped with a p-type dopant (e.g., Mg or Zn) and represented by the aforementioned formula may be employed.

After completion of stacking of semiconductor layers of interest, a positive electrode and a negative electrode are formed at predetermined positions. No particular limitation is imposed on the positive and negative electrodes for use in compound semiconductor light-emitting devices, and any known positive and negative electrodes having a variety of compositions and structures may be employed in the present invention. No particular limitation is imposed on the method for producing the electrodes, and any known method such as vacuum vapor deposition or sputtering may be employed.

EXAMPLES

The present invention will next be described in more detail by way of Examples, which should not be construed as limiting the invention thereto.

Example 1

FIG. 2 schematically shows a cross-section of a stacked structure containing a Ge-doped n-type Group III nitride semiconductor layer fabricated in Example 1.

A stacked structure including a sapphire substrate and Group III nitride semiconductor layers successively stacked on the substrate was formed by means of conventional reduced-pressure MOCVD through the following procedure. Firstly, a (0001)-sapphire substrate 1 was placed on a high-purity graphite (for semiconductor) susceptor to be heated at a film formation temperature by a high-frequency (RF) induction heater. The sapphire substrate placed on the susceptor was placed in a stainless steel-made vapor growth reactor furnace, and the reactor furnace was purged with nitrogen.

After passage of nitrogen in the vapor growth reactor furnace for 8 minutes, the substrate 1 was heated over 10 minutes from room temperature to 600° C. by means of the induction heater. While the substrate 1 was maintained at 600° C., hydrogen gas and nitrogen gas were caused to flow in the vapor growth reactor furnace so as to adjust the pressure inside the furnace to $1.5 \times 10^4$ Pa. The surface of the substrate 1 was thermally cleaned by allowing the substrate to stand for 2 minutes under the temperature/pressure conditions. After completion of thermal cleaning, the supply of nitrogen gas was stopped, but hydrogen was continuously supplied to the reactor furnace.

Subsequently, the substrate 1 was heated to 1,120° C. under hydrogen. After confirmation that a constant temperature of 1,120° C. was attained, hydrogen gas containing trimethylaluminum (TMA) vapor was supplied to the vapor growth reactor furnace for 8 minutes 30 seconds. Through this step, the supplied TMA was caused to react with N atoms which had been released through decomposition of nitrogen-containing deposits on an inner wall of the reactor furnace, thereby depositing a high-temperature buffer layer 2 composed of an aluminum nitride (AlN) thin film having a thickness of some nm, on the sapphire substrate 1. Supply of hydrogen gas containing TMA vapor into the vapor growth reactor furnace was stopped, thereby completing growth of AlN. The conditions were maintained for 4 minutes, whereby the TMA vapor remaining in the furnace was completely removed.

Subsequently, ammonia (NH$_3$) gas was supplied to the vapor growth reactor furnace. Four minutes after the start of supply of ammonia gas, the susceptor temperature was lowered to 1,040° C. under ammonia flow. After confirmation that the susceptor temperature was lowered to 1,040° C. and the susceptor maintained a constant temperature of 1,040° C., supply of trimethylgallium (TMG) into the vapor growth reactor furnace was started, and a base layer 3 composed of undoped GaN was grown for one hour. The thickness of the base layer 3 was adjusted to 2 µm.

Subsequently, the substrate 1 was heated to 1,120° C. After confirmation that a constant temperature of 1,120° C. was attained, tetramethylgermanium ((CH$_3$)$_4$Ge) was supplied for 18 seconds, followed by stopping supply for 18 seconds. The cycle was repeated 100 times, to thereby form a Ge-doped n-type GaN layer 4 having a thickness of 2.0 µm which was composed of the high-Ge-concentration layers and low-Ge-concentration layers of the present invention and in which Ge concentration periodically varied layer-by-layer.

After completion of the growth of the Ge-doped n-type GaN layer 4, the substrate 1 was allowed to cool to room temperature over about 20 minutes through stopping the current supply to the induction heater. During cooling, the inside atmosphere of the vapor growth reactor furnace was formed solely of nitrogen. After confirmation that the substrate 1 was cooled to room temperature, the stacked structure was removed from the vapor growth reactor furnace to the outside.

The Ge-doped n-type GaN layer 4 of the thus-produced stacked structure was found to have a carrier concentration, as measured on the basis of Hall effect, of $7 \times 10^{18}$ cm$^{-3}$. The n-type GaN layer 4 had a remarkably flat surface having a pit density of 200/cm$^2$ or less. Through SIMS analysis, each higher concentration layer was found to have a Ge atom concentration of $1.2 \times 10^{19}$ cm$^{-3}$ and a thickness of 10 nm, and each lower concentration layer was found to have a Ge atom concentration of $1 \times 10^{18}$ cm$^{-3}$ and a thickness of 10 nm.

SIMS analysis was carried out under the following conditions: primary ion species of Cs$^+$, acceleration voltage of 14.5 keV, ionic current of 40 nA, raster area of 100 µm$^2$, and analysis area of 30 µm$^2$.

A sample separately taken out from the furnace after the growth of the higher concentration layer was observed under an atomic force microscope. As a result, it was found that the density of pits produced on the surface of the higher concentration layer was $2 \times 10^7$/cm$^2$.

Example 2

The procedure of Example 1 was repeated, except that a plane direction of a surface of a sapphire substrate was inclined from a direction <0001> to a direction <1-100> (an inclination angle: 0.35 degree), to thereby form a stacked structure.

The Ge-doped n-type GaN layer 4 of the thus-produced stacked structure was found to have a carrier concentration, as measured on the basis of Hall effect, of $7 \times 10^{18}$ cm$^{-3}$, which is equivalent to that obtained in Example 1. The n-type GaN layer 4 had a remarkably flat surface having a pit density of 180/cm$^2$ or less. Also, a sample separately taken out from the furnace after the growth of the higher concentration layer was observed under an atomic force microscope. As a result, it was found that the density of pits produced on the surface of the higher concentration layer was $1 \times 10^7$/cm$^2$.

Example 3

The procedure of Example 1 was repeated, except that a Ge-doped n-type GaN layer 4 having a thickness of 2.0 µm was formed through supplying (CH$_3$)$_4$Ge for 9 seconds, followed by stopping supply for 9 seconds, and repeating the cycle 200 times, to thereby form a stacked structure.

The Ge-doped n-type GaN layer 4 of the thus-produced stacked structure was found to have a carrier concentration, as measured on the basis of Hall effect, of $7 \times 10^{18}$ cm$^{-3}$, which is equivalent to that obtained in Example 1. Through SIMS analysis, each higher concentration layer was found to have a Ge atom concentration of $1.2 \times 10^{19}$ cm$^{-3}$ and a thickness of 5 nm, and each lower concentration layer was found to have a Ge atom concentration of $1 \times 10^{18}$ cm$^{-3}$ and a thickness of 5 nm. The n-type GaN layer 4 had a surface having a pit density of 4,000/cm$^2$. Although the pit density is slightly higher than that obtained in Example 1, the surface was very flat as compared with a conventional Ge-doped n-type semiconductor layer.

Comparative Example 1

The procedure of Example 1 was repeated, except that a Ge-doped n-type GaN layer 4 having a thickness of 2.0 µm was formed through supplying (CH$_3$)$_4$Ge at a constant flow rate, to thereby form a stacked structure. The flow rate of (CH$_3$)$_4$Ge was adjusted such that the Ge-doped n-type GaN layer 4 exhibited a carrier concentration, as measured on the basis of Hall effect, of $7 \times 10^{18}$ cm$^{-3}$, which is equivalent to that obtained in Example 1.

The Ge-doped GaN layer 4 of the thus-produced stacked structure had a surface having a pit density as remarkably high as $1 \times 10^6$/cm$^3$. Thus, a flat surface was not obtained.

Example 4

A Group III nitride semiconductor light-emitting device was fabricated through further stacking a Group III nitride semiconductor layer on the stacked structure produced in Example 1. FIG. 2 schematically shows a cross-section of a Group III nitride semiconductor light-emitting device fabricated in Example 3.

The procedure of Example 1 was repeated, to thereby form a Ge-doped n-type GaN layer 4. After formation of the Ge-doped n-type GaN layer 4, an undoped n-type $Al_{0.07}Ga_{0.93}N$ cladding layer 5 having a thickness of 12.5 nm was stacked on the GaN layer at 1,060° C.

The substrate 1 was cooled to 730° C. and, on the undoped n-type $Al_{0.07}Ga_{0.93}N$ cladding layer 5, a light-emitting layer 6 having a multiple (5 cycles) quantum well structure including $Al_{0.03}Ga_{0.97}N$ barrier layers 6a and $In_{0.25}Ga_{0.75}N$ well layers 6b was provided. In fabrication of the light-emitting layer 6 having a multiple quantum well structure, an $Al_{0.03}Ga_{0.97}N$ barrier layer 6a was joined to the undoped n-type $Al_{0.07}Ga_{0.93}N$ cladding layer 5.

The $Al_{0.03}Ga_{0.97}N$ barrier layers 6a were grown in an undoped state by use of trimethylaluminum (TMA) as an aluminum source and triethylgallium (TEG) as a gallium source, and each layer had a thickness of 8 nm. The $In_{0.25}Ga_{0.75}N$ well layers 6b were grown in an undoped state by use of triethylgallium (TEG) as a gallium source and trimethylindium (TMI) as an indium source, and each layer had a thickness of 2.5 nm.

On the light-emitting layer 6 having a multiple quantum well structure, a magnesium (Mg)-doped p-type $Al_{0.07}Ga_{0.93}N$ cladding layer 7 having a thickness of 10 nm was formed. On the p-type $Al_{0.07}Ga_{0.93}N$ cladding layer 7, an Mg-doped p-type GaN contact layer 8 was formed. Biscyclopentadienyl Mg was employed as an Mg dopant source. Mg was added in such an amount that the p-type GaN contact layer 8 had a hole concentration of $8 \times 10^{17}$ cm$^{-3}$. The p-type GaN contact layer 8 had a thickness of 100 nm.

After completion of growth of the p-type GaN contact layer 8, the substrate 1 was allowed to cool to room temperature over about 20 minutes through stopping the current supply to the induction heater. During cooling, the inside atmosphere of the vapor growth reactor furnace was formed solely of nitrogen. After confirmation that the substrate 1 was cooled to room temperature, the stacked structure was removed from the vapor growth reactor furnace to the outside. At this instance, the p-type GaN contact layer 8 exhibited p-type conductivity, even though the layer had undergone no annealing for electrically activating the p-type carrier (Mg).

Subsequently, through a known photolithographic technique and a conventional dry etching technique, the high-Ge-concentration layer of the Ge-doped n-type GaN layer 4 was exposed exclusively in an area where an n-type Ohmic electrode 9 was to be formed. On the thus-exposed surface of the high-Ge-concentration layer, an n-type Ohmic electrode (titanium (semiconductor side)/gold) 9 was formed. On the entire surface of the p-type GaN contact layer 8 serving as the remaining surface of the stacked structure, nickel and gold were successively stacked through a conventional vacuum vapor deposition means, a known photolithographic means, and other means, thereby forming a p-type Ohmic electrode 10.

Thereafter, the stacked structure was cut into LED chips of a square shape (350 μm×350 μm), and each chip was placed on a lead frame which was bonded to a gold wire for allowing device operation current to flow from the lead frame to the LED chip.

Upon passage of forward device operation current between the n-type and the p-type Ohmic electrodes 9 and 10 via the lead frame, the chip exhibited forward voltage of 3.5 V at a forward current of 20 mA. The emission center wavelength of the band of blue light emission at a forward current of 20 mA was found to be 460 nm. The emission intensity of the light emitted from the chip, as determined through a typical integrating sphere, was 5 mW. Thus, a Group III nitride semiconductor light-emitting device attaining high emission intensity was successfully fabricated.

Example 5

The procedure of Example 4 was repeated, except that the stacked structure produced in Example 3 was employed, to thereby fabricate a Group III nitride semiconductor light-emitting device. The light-emitting device exhibited a forward voltage of 3.5 V and an emission intensity of 4.8 mW, as determined through measurement similar to that of Example 4. The emission center wavelength of the blue light emission band was found to be 455 nm.

Comparative Example 2

The procedure of Example 4 was repeated, except that the stacked structure produced in Comparative Example 1 was employed, to thereby fabricate a Group III nitride semiconductor light-emitting device. When measurement similar to that of Example 4 was carried out, the light-emitting device exhibited a forward voltage of 3.5 V, which was equivalent to the values obtained in Examples 4, but the emission intensity was found to be as low as 0.4 mW.

Comparative Example 3

The procedure of Example 4 was repeated, except that an n-type GaN layer (thickness: 2 μm) uniformly doped with Si at a concentration of $7 \times 10^{18}$ cm$^{-3}$ was formed instead of the Ge-doped n-type GaN layer 4, to thereby fabricate a Group III nitride semiconductor light-emitting device. Through measurements similar to that of Example 4, the light-emitting device exhibited a forward voltage of 3.5 V, which was equivalent to the values obtained in Examples 4, but the emission intensity was found to be 4 mW, which was 20% lower than that obtained in Example 4.

Example 6

The procedure of Example 1 was repeated, except that the feed rate of $(CH_3)_4Ge$ was adjusted such that the Ge-doped n-type GaN layer 4 exhibited a carrier concentration, as measured on the basis of Hall effect, of $3 \times 10^{17}$ cm$^{-3}$, to thereby form a stacked structure.

The Ge-doped n-type GaN layer 4 of the thus-produced stacked structure had a remarkably flat surface having no pit. Through SIMS analysis, each higher concentration layer was found to have a Ge atom concentration of $5.8 \times 10^{18}$ cm$^{-3}$ and a thickness of 10 nm, and each lower concentration layer was found to have a Ge atom concentration of $2 \times 10^{17}$ cm$^{-3}$ and a thickness of 10 nm.

A sample separately taken out from the furnace after the growth of the higher concentration layer was observed under an atomic force microscope. As a result, it was found that the density of pits produced on the surface of the higher concentration layer was $1 \times 10^5$/cm$^2$.

On this stacked structure was further stacked a group III nitride semiconductor layer in the same manner as in Example 4. Thus, a group III nitride semiconductor light-emitting device was prepared.

The forward voltage and the emission intensity were measured in the same manner as in Example 4. As a result, the emission intensity was identical to that in Example 4 and was 5 mW. The forward voltage was 4.2 V, that is, was higher than that in Examples 4.

Example 7

A stacked structure was formed in the same manner as in Example 1, except that the Ge-doped n-type GaN layer 4 was formed by the following method.

After the formation of the base layer 3, the growth temperature was raised to 1120° C. When the temperature became stable, $(CH_3)_4Ge$ was allowed to flow into the reactor for 18 sec to form a higher concentration layer. Thereafter, the feed of TMG and $(CH_3)_4Ge$ was stopped to stop the growth. The temperature of the reactor was raised to 1150° C., and only TMG was again fed to allow a layer to be grown for 18 sec to form an undoped layer as a lower concentration layer. Thereafter, the feed of TMG was stopped, and the temperature was dropped to 1120° C. This procedure constitutes one cycle. This cycle was repeated 100 times to form a 2.0 μm-thick Ge-doped n-type GaN layer 4 in which the Ge concentration was periodically varied.

The Ge-doped n-type GaN layer 4 of the thus-produced stacked structure was found to have a carrier concentration, as measured on the basis of Hall effect, of $7 \times 10^{18}$ cm$^{-3}$. The n-type GaN layer 4 had a remarkably flat surface having a pit density of 100/cm$^2$ or less. Through SIMS analysis, each higher concentration layer was found to have a Ge atom concentration of $1.2 \times 10^{19}$ cm$^{-3}$ and a thickness of 10 nm, and each lower concentration layer was found to have a Ge atom concentration of $1 \times 10^{18}$ cm$^{-3}$ and a thickness of 10 nm.

A sample separately taken out from the furnace after the growth of the higher concentration layer was observed under an atomic force microscope. As a result, it was found that the density of pits produced on the surface of the higher concentration layer was $1 \times 10^7$/cm$^2$.

INDUSTRIAL APPLICABILITY

The n-type Group III nitride semiconductor layered structure produced in the present invention exhibits excellent surface flatness and low resistance. Therefore, the layered structure is useful for a Group III nitride semiconductor light-emitting device.

The invention claimed is:

1. A n-type group III nitride semiconductor layered structure comprising a substrate and, stacked on the substrate, an n-type impurity concentration periodic variation layer comprising an n-type impurity atom higher concentration layer and an n-type impurity atom lower concentration layer, said n-type impurity atom being Ge, pits being provided on a surface of the higher concentration layer (a surface remote from the substrate), and the lower concentration layer being stacked on the higher concentration layer, wherein the higher concentration layer and the lower concentration layer are provided in an alternate and periodic manner, the repetition number of the higher concentration layer and the lower concentration layer is 10 to 1000 and a thickness of a repetition cycle is 1 nm to 1000 nm.

2. The n-type group III nitride semiconductor layered structure according to claim 1, wherein the number of pits formed is in the range of $1 \times 10^5$/cm$^2$ to $1 \times 10^{10}$/cm$^2$.

3. The n-type group III nitride semiconductor layered structure according to claim 1, wherein the flatness (Ra) of the surface of the lower concentration layer (a surface remote from the substrate) is not more m 10 angstroms.

4. The n-type group III nitride semiconductor layered structure according to claim 1, wherein the thickness of the higher concentration layer and the thickness of the lower concentration layer each are 0.5 to 500 nm.

5. The n-type group III nitride semiconductor layered structure according to claim 1, wherein the thickness of the lower concentration layer is equal to or larger than the thickness of the higher concentration layer.

6. The n-type group III nitride semiconductor layered structure according to claim 1, wherein the thickness of the n-type impurity concentration periodic variation layer is 0.1 to 10 μm.

7. The n-type group III nitride semiconductor layered structure according to claim 1, wherein the concentration of the n-type impurity in the higher concentration layer is $5 \times 10^{17}$ to $5 \times 10^{19}$ cm$^{-3}$.

8. The n-type group III nitride semiconductor layered structure according to claim 1, wherein the concentration of the n-type impurity in the lower concentration layer is lower than the concentration of the n-type impurity in the higher concentration layer and is not more than $2 \times 10^{19}$ cm$^{-3}$.

9. The n-type group III nitride semiconductor layered structure according to claim 8, wherein the n-type impurity is not intentionally doped into the lower concentration layer.

10. The n-type group III nitride semiconductor layered structure according to claim 1, which comprises a base layer, having a lower carrier concentration than the n-type impurity concentration periodic variation layer, between said substrate and said n-type impurity concentration periodic variation layer.

11. The n-type group III nitride semiconductor layered structure according to claim 10, wherein said base layer contains an n-type impurity as a dopant and the concentration of the n-type impurity is not more than $5 \times 10^{18}$ cm$^{-3}$.

12. The n-type group III nitride semiconductor layered structure according to claim 11, wherein said base layer is undoped.

13. The n-type group III nitride semiconductor layered structure according to claim 10, wherein the thickness of the base layer is not less than 1 μm and not than 20 μm.

14. The n-type group III nitride semiconductor layered structure according to claim 13, wherein the thickness of the base layer is not less than 5 μm and not more than 15 μm.

15. The n-type group III nitride semiconductor layered structure according to claim 10, wherein the carrier concentration of the base layer is not more than $5 \times 10^{17}$ cm$^{-3}$.

16. The n-type group III nitride semiconductor layered structure according to claim 1, wherein the plane direction of the surface of the substrate is slightly inclined with respect to the just direction.

17. The n-type group III nitride semiconductor layered structure according to claim 16, wherein the plane direction of the surface of the substrate is inclined by 0.05 to 0.6 degree with respect to the just direction.

18. The n-type group III nitride semiconductor layered structure according to claim 16 wherein said substrate is selected from the group consisting of oxide single crystal materials such as sapphire (α-$Al_2O_3$ single crystal), zinc oxide (ZnO), and gallium lithium oxide ($LiGaO_2$), group IV semiconductor single crystals including silicon (Si) single crystals (silicon) and cubic or hexagonal silicon carbide (SiC), and group III-V compound semiconductor single crystals including gallium phosphide (GaP), gallium arsenide (GaAs), and gallium nitride (GaN).

19. A process for producing a n-type group III nitride semiconductor layered structure, which layered structure comprises a substrate and an n-type impurity concentration periodic variation layer stacked on the substrate, the variation layer comprising an n-type impurity atom higher concentration layer and an n-type impurity atom lower concentration layer; wherein said n-type impurity atom is Ge, wherein pits are provided on a surface of the higher concentration layer remote from the substrate, wherein the lower concentration layer is stacked on the higher concentration layer, and wherein the higher concentration layer and the lower concentration layer are provided in an alternate and periodic manner where the repetition number of the higher concentration layer and the lower concentration layer is a number from 10 to 1000 and a thickness of a repetition cycle is 1 nm to 1000 nm, which process comprises stacking each of the n-type impurity atom higher concentration layer and the n-type impurity atom lower concentration layer so that, in addition to the concentration of the n-type impurity to be doped, conditions for growth within a reactor are also differentiated.

20. The process according to claim 19 wherein conditions for growth of the lower concentration layer are differentiated from conditions for growth of the higher concentration layer so that two-dimensional growth of the layer is accelerated during the growth of the lower concentration layer.

21. The process according to claim 19, wherein the lower concentration layer is grown at a temperature different from the temperature at which the higher concentration layer is grown.

22. The process according to claim 21, wherein the lower concentration layer is grown at a temperature above the temperature at which the higher concentration layer is grown.

23. The process according to claim 19, wherein the lower concentration layer is grown at a pressure different from the pressure at which the higher concentration layer is grown.

24. The process according to claim 23, wherein the lower concentration layer is grown at a pressure lower than the pressure at which the higher concentration layer is grown.

25. The process according to claim 19, wherein the carrier gas flow rate in the growth of the lower concentration layer is different from the carrier gas flow rate in the growth of the higher concentration layer.

26. The process according to claim 25, wherein the carrier gas flow rate in the growth of the lower concentration layer is higher than the carrier gas flow rate in the growth of the higher concentration layer.

27. The process according to claim 19, wherein the growth speed of the lower concentration layer is different from the growth speed of the higher concentration layer.

28. The process according to claim 27, wherein the growth speed of the lower concentration layer is lower than the growth speed of the higher concentration layer.

29. The process according to claim 19, wherein the nitrogen/III ratio in the growth of the lower concentration layer is different from the nitrogen/III ratio in the growth of the higher concentration layer.

30. The process according to claim 29, wherein the nitrogen/III ratio in the growth of the lower concentration layer is lower than the nitrogen/III ratio in the growth of the n-type impurity atom higher concentration layer.

31. A group III nitride semiconductor light-emitting device comprising a light-emitting layer composed of a group III nitride semiconductor provided on the substrate, wherein the n-type group III nitride semiconductor layered structure according to claim 1 is provided between the substrate and the light-emitting layer.

32. The n-type group III nitride semiconductor layered structure according to claim 17 wherein said substrate is selected from the group consisting of oxide single crystal materials such as sapphire ($\alpha$-$Al_2O_3$ single crystal), zinc oxide (ZnO), and gallium lithium oxide ($LiGaO_2$), group IV semiconductor single crystals including silicon (Si) single crystals (silicon) and cubic or hexagonal silicon carbide (SiC), and group III-V compound semiconductor single crystals including gallium phosphide (GaP), gallium arsenide (GaAs), and gallium nitride (GaN).

* * * * *